United States Patent
List et al.

(10) Patent No.: US 9,925,941 B2
(45) Date of Patent: Mar. 27, 2018

(54) ENERGY SUPPLY UNIT AND METHOD FOR OPERATING AN ENERGY SUPPLY UNIT FOR AUTONOMOUSLY SUPPLYING A CONSUMER

(71) Applicant: Robert Bosch GmbH, Stuttgart (DE)

(72) Inventors: Carsten List, Walheim (DE); Hartmut Schumacher, Freiberg (DE); Falko Sievers, Hamburg (DE)

(73) Assignee: Robert Bosch GmbH, Stuttgart (DE)

( * ) Notice: Subject to any disclaimer, the term of this patent is extended or adjusted under 35 U.S.C. 154(b) by 424 days.

(21) Appl. No.: 14/763,315

(22) PCT Filed: Dec. 11, 2013

(86) PCT No.: PCT/EP2013/076231
§ 371 (c)(1),
(2) Date: Jul. 24, 2015

(87) PCT Pub. No.: WO2014/117896
PCT Pub. Date: Aug. 7, 2014

(65) Prior Publication Data
US 2015/0343978 A1    Dec. 3, 2015

(30) Foreign Application Priority Data

Jan. 31, 2013   (DE) .................. 10 2013 201 641

(51) Int. Cl.
*B60R 21/017* (2006.01)
*G01R 19/165* (2006.01)
*H02J 9/06* (2006.01)

(52) U.S. Cl.
CPC .... *B60R 21/0173* (2013.01); *G01R 19/16542* (2013.01); *H02J 9/061* (2013.01); *G01R 19/16538* (2013.01); *Y10T 307/615* (2015.04)

(58) Field of Classification Search
None
See application file for complete search history.

(56) References Cited

U.S. PATENT DOCUMENTS

| | | |
|---|---|---|
| 5,142,215 A | 8/1992 | Mathison |
| 7,973,426 B2 | 7/2011 | Schumacher et al. |
| | (Continued) | |

FOREIGN PATENT DOCUMENTS

| | | |
|---|---|---|
| JP | 2004304334 A | 10/2004 |
| JP | 2006524602 A | 11/2006 |
| | (Continued) | |

*Primary Examiner* — Jared Fureman
*Assistant Examiner* — James Evans
(74) *Attorney, Agent, or Firm* — Norton Rose Fulbright US LLP; Gerard Messina (57) ABSTRACT

An energy supply unit for supplying a consumer, includes an energy store to supply electric when the consumer is decoupled from an energy supply network. The energy supply unit includes an energy supply controller having an input coupled to the energy store, via a diode, for receiving electric energy and an output for delivering electric energy, and a monitoring unit for outputting a monitoring signal, configured to set the monitoring signal to an active state when an output voltage between the output and a reference potential is lower/greater than a predefined activation threshold value, the monitoring unit configured, when an excessively low input voltage is identified between the input and reference potential of the controller, especially paired with an excessively low output voltage, the monitoring signal is switched to the inactive state when the input voltage is above a reset threshold and the output voltage is within the monitoring band.

17 Claims, 9 Drawing Sheets

(56) References Cited

U.S. PATENT DOCUMENTS

| | | | |
|---|---|---|---|
| 2003/0220026 A1 | 11/2003 | Oki et al. | |
| 2007/0120694 A1 | 5/2007 | Lindsey et al. | |
| 2007/0139018 A1* | 6/2007 | Mentelos | H02J 9/061 320/166 |
| 2009/0206656 A1* | 8/2009 | Schumacher | B60R 16/03 307/9.1 |
| 2012/0292984 A1* | 11/2012 | Iwagami | B60R 16/00 307/9.1 |

FOREIGN PATENT DOCUMENTS

| | | |
|---|---|---|
| JP | 2007299156 A | 11/2007 |
| JP | 2008178196 A | 7/2008 |
| JP | 2009508743 A | 3/2009 |
| JP | 2010017067 A | 1/2010 |

\* cited by examiner

ENERGY SUPPLY UNIT AND METHOD FOR OPERATING AN ENERGY SUPPLY UNIT FOR AUTONOMOUSLY SUPPLYING A CONSUMER

FIELD OF THE INVENTION

The present invention relates to an energy supply unit for autonomously supplying a consumer, to a method for operating an energy supply unit for autonomously supplying a consumer, and to a corresponding computer program product.

BACKGROUND INFORMATION

Voltage regulators are monitored with respect to their output voltage in safety-relevant systems. If the input voltage of such a voltage regulator slowly decreases, as is possible in buffered energy reserve-based systems (airbag, etc.), the output voltage is reduced when a drop below a minimal control input voltage occurs. When the output voltage reaches a lower monitoring limit, a RESET signal (for the identification of an undervoltage at the regulator output) is triggered, which may be used as a monitoring signal to control consumers connected to the regulator. This RESET (i.e., the monitoring signal RESET) resets all digital states to the starting state and stops clocked program processing steps and digital state machines. This also results in a synchronous load reduction of the regulator (regulator output current is synchronously reduced). Since voltage regulators have a finite internal resistance when leaving the voltage regulating range to the downside, a regulator output current reduction in this range results in an increase in the control output voltage due a decreasing regulator drop. As a result, the RESET undervoltage limit is again exceeded, multiple RESET pulses being generated in particular in the case of strong regulator input buffering (e.g., when the energy reserve is high).

SUMMARY OF THE INVENTION

Against this background, the present invention introduces an energy supply unit for autonomously supplying a consumer, a passenger safety device, a method for operating an energy supply unit for autonomously supplying a consumer, and a corresponding computer program product as recited in the main descriptions herein. Advantageous embodiments are derived from the particular sub-descriptions herein and the following description.

The approach described here creates in particular an energy supply unit for autonomously supplying a consumer, the energy supply unit including the following features:

an energy store, which is configured to supply electric energy to a consumer when the electrical consumer is decoupled from an energy supply network;
an energy supply controller having an input coupled to the energy store for receiving electric energy and an output for delivering electric energy to the consumer; and
a monitoring unit for outputting a monitoring signal, the monitoring unit being configured to set the monitoring signal to an active state when an output voltage present between the output and a reference potential is lower than a predefined activation threshold value of the control voltage, or when an output voltage present between the output and a reference potential is greater than a predefined activation threshold value of the control voltage, the monitoring unit furthermore being configured to set the monitoring signal to an inactive state if the output voltage does not violate an activation threshold and/or an input voltage of the energy supply controller present between the input and the reference potential has risen or is again above a reset threshold value.

It is furthermore favorable when also temporal requirements in regard to the RESET signal are implemented. If the conditions for a transition from the RESET "active" state to a RESET "inactive" state occur, this condition becomes effective in the RESET signal only after a delay time. A "short" filter time may also be useful in the reverse transition.

The approach described here also creates a method for operating an energy supply unit in one variant described here for autonomously supplying a consumer, the method including the following steps:

setting the monitoring signal to an active state when an output voltage present between the output and a reference potential is lower than a predefined activation threshold value; and
bringing the monitoring signal into an inactive state when an input voltage present between the input and the reference potential has risen again above a reset threshold value.

According to one particularly favorable specific embodiment, the approach described here furthermore creates a method for operating an energy supply unit in one variant described here for autonomously supplying a consumer, the method including the following steps:

setting the monitoring signal to an active state when an output voltage present between the output and a reference potential is lower than a predefined activation threshold value, or when an output voltage present between the output and a reference potential is greater than a predefined activation threshold value; furthermore a (short) delay timer being started, so that the "active" state does not become effective in the monitoring signal (RESET signal) until after a defined filter time;
bringing the monitoring signal into an inactive state if the output voltage does not violate an activation threshold and/or an input voltage of the energy supply controller present between the input and the reference potential has risen or is again above a reset threshold; and
starting a further delay timer so that the inactive state does not become effective in the monitoring signal (RESET signal) until after a defined minimum RESET active duration.

Moreover a control unit is described, which is configured to carry out or implement the steps of one variant of a method described here in corresponding devices. The object of the present invention may also be achieved quickly and efficiently by this embodiment variant of the present invention in the form a control unit.

In this way, the approach described here also introduces a control unit for operating an energy supply unit in one variant described here for autonomously supplying a consumer, the control unit including the following features:

a device for setting the monitoring signal to an active state when an output voltage present between the output and a reference potential is lower than a predefined activation threshold value; and
a device for bringing the monitoring signal into an inactive state when an input voltage present between the input and the reference potential has risen again above a reset threshold value.

According to one particular specific embodiment of the present invention, in particular a control unit for operating an energy supply unit in one variant described here for autonomously supplying a consumer is described, the control unit including the following features:
- a device for setting the monitoring signal to an active state when an output voltage present between the output and a reference potential is lower than a predefined activation threshold value and/or for setting the monitoring signal to an active state when an output voltage present between the output and a reference potential is greater than a predefined activation threshold value;
- a device for starting a (short) delay timer so that the active state does not become effective in the RESET signal until after a defined filter time;
- a device for bringing the monitoring signal into an inactive state if the output voltage does not violate an activation threshold and an input voltage of the energy supply controller present between the input and the reference potential has risen or is again above a reset threshold; and
- starting a further delay timer so that the inactive state does not become effective in the monitoring signal (RESET signal) until after a defined minimum RESET active duration.

A control unit in the present invention may be understood to mean an electrical device which processes sensor signals and outputs control and/or data signals as a function thereof. The control unit may include an interface which may be configured as hardware and/or software. In the case of a hardware configuration, the interfaces may, for example, be part of a so-called system ASIC which includes a wide variety of functions of the control unit. However, it is also possible for the interfaces to be separate integrated circuits, or to be at least partially composed of discrete components. In the case of a software configuration, the interfaces may be software modules which are present on a microcontroller, for example, in addition to other software modules.

In addition, a computer program product is advantageous, having program code which may be stored on a machine-readable carrier such as a semiconductor memory, a hard disk memory or an optical memory, and which is used to carry out the method according to one of the specific embodiments described above, if the program product is executed on a computer or a device.

An autonomous supply of a consumer may be understood to mean a supply, for example with electric energy, which is decoupled from an energy supply network. An energy store may be understood to mean, for example, a capacitor or an electrochemical energy store, which is charged during a period of a coupling to the energy supply network and is able to autonomously supply the consumer with the aid of the energy supply unit after a decoupling from the energy supply network. An energy supply controller may be understood to mean a unit which adapts a voltage and/or an electric current at an input of the energy supply controller in accordance with an adaptation regulation to a voltage and/or an electric current which is output at an output of the energy supply controller. A monitoring unit may be understood to mean a unit which monitors a voltage present at the input and/or output of the energy supply controller and outputs a corresponding monitoring signal.

The monitoring signal may be a digital signal, for example, and furthermore be provided, for example, to control, such as stop or restart, an operation and/or a function of the consumer. An active state of the monitoring signal may be understood to mean a signal state which indicates to a consumer that an operation and/or a function of the consumer should be suppressed or stopped. An inactive state of the monitoring signal may be understood to mean a signal state which indicates to a consumer that an operation and/or a function of the consumer may be carried out without restrictions. A lower activation threshold value of the control output voltage may be understood to be, for example, a predefined lower limiting value of a voltage, a drop below which causes the monitoring signal to be switched to a state which indicates to a consumer that an operation or a function of the consumer should be stopped or halted (active state). An upper activation threshold value of the control output voltage may be understood to be, for example, a predefined upper limiting value of a voltage, which when exceeded causes the monitoring signal to be switched to a state which indicates to a consumer that an operation or a function of the consumer should be stopped or halted (active state). A reference potential may be understood to mean a ground potential, for example, or another potential in the energy supply unit which serves as a reference for the measurement of a voltage at further terminals or contacts of elements of the energy supply unit.

A reset threshold value of the control input voltage may be understood to mean a predefined limiting value of a voltage, for example, which provides an indication of the fact that the energy store is being or has been recharged, so that electric energy is available again to ensure an operation or a function of the consumer, or to enable an operation or a function of the consumer at least for a certain time period (the monitoring signal being brought into an inactive state depending on additional conditions).

The approach described here is based on the finding that repeat signal changes of the monitoring signal, with an ensuing periodically fluctuating output voltage causing faults/interferences at the consumer, must be avoided in the case of an autonomous supply of the consumer, as a result of which a fault-free operation or a fault-free function may no longer be ensured by the stored energy being consumed.

If the energy stored in the energy store is no longer sufficient for a fault-free operation or a fault-free function in the case of an autonomous supply of the consumer, a function or the operation of the consumer is stopped by the output of the monitoring signal. However, taking the internal resistance of the energy supply controller into consideration, this would cause a reduction of a current flow across the energy supply controller to result in a drop of a voltage between the input and the output of the energy supply controller, which in the case of sole monitoring or a deactivation of the monitoring signal based on the output voltage could cause the output voltage to again exceed the lower activation threshold value, and thus for the monitoring signal to be reset. If the consumer now reactivates its operation or a function again, this would cause the output voltage, as a result of the now incipient current flow across the energy supply controller, to again drop below the activation threshold value, and thus for the monitoring signal to be reactivated. This would therefore cause the consumer to be operated with a periodically fluctuating supply (fault/disturbance—danger). However, if the monitoring signal is now deactivated, while additionally the input voltage of the energy supply controller is evaluated, such periodic events may be avoided.

The approach described here offers the advantage that an operation or a function of a consumer with periodically fluctuating input voltage does not take place due to the avoidance of repeat changes in the monitoring signal during a slowly decreasing input voltage of the energy supply controller (energy depletion in the energy store), which overall ensures a more robust and more reliable mode of operation of the consumer/function until shut-off.

According to one advantageous specific embodiment of the present invention, the monitoring unit may be configured to set the monitoring signal to an active state when the input voltage is lower than a second activation threshold (=threshold of the input voltage of the energy supply controller), in particular the second activation threshold value being identical to the reset threshold value. Such a specific embodiment of the present invention offers the advantage that it is possible to ensure with a technically simple arrangement that the monitoring signal is activated when, as an alternative or in addition to the drop of the output voltage below the activation threshold value, the input voltage of the energy supply controller is lower than a predefined limiting value (as a second activation threshold value). As an alternative or in addition to the above-mentioned activation condition for the monitoring signal, it is possible in this way to take into consideration that, in the case of a known maximal voltage drop across the energy supply controller, the monitoring signal is activated, i.e., is set to the active state, when the input voltage at the energy supply controller as a result of the drop below the second activation threshold value allows a conclusion that a consumer connected to the output could no longer be operated at full load, even though the output voltage (for example, due to an operation of the consumer outside the full load range) has not yet dropped below the activation threshold.

Also favorable is a specific embodiment of the present invention in which the monitoring unit includes at least one digital circuit, in particular a logic circuit, to generate the monitoring signal. Such a specific embodiment of the present invention offers the advantage, using a technically very simple arrangement, to be able to provide the monitoring signal which allows clear signal states for controlling or regulating a consumer connected to the output of the energy supply controller.

Also advantageous is a specific embodiment of the present invention in which the monitoring unit includes at least one resettable flip flop element, in particular a D flip flop, to generate the monitoring signal. Such an element for generating the monitoring signal, in particular the monitoring signal being tapped at an output of such a flip flop element or being derived from a signal of an output of such a flip flop element, is technically easy and cost-effective to implement.

To continue to maintain the active state of the monitoring signal for a certain duration even after correct conditions were identified at the energy supply controller (input and output voltages are correct), according to one favorable specific embodiment of the present invention the monitoring unit may include at least one digital element, which is clocked with a defined clock signal (CLK) or is clocked as a function of the output voltage (counter etc.).

According to one further specific embodiment of the present invention, the monitoring unit may include at least one digital element which is reset as a function of the input voltage of the energy supply controller. Such a specific embodiment of the present invention offers the advantage that the stored activation of the monitoring signal which is independent of the output voltage of the energy supply controller is suspended again (reset).

To ensure in a particularly robust manner that only a true drop of the output voltage of the energy supply controller, and no transients, activate the monitoring signal, according to one specific embodiment of the present invention the monitoring unit is configured to delay the output of the monitoring signal in the second state by a predefined duration in the case of a change of the monitoring signal from a first state to a second state, and not to delay the output of the monitoring signal in the first state in the case of a change of the monitoring signal from the second state to the first state.

A specific embodiment of the present invention is particularly advantageous as a passenger safety device for a vehicle having an occupant and/or road user protection device which is coupled as a consumer to the energy supply unit according to one variant described here. For example, an occupant protection device may be a control unit for an airbag, a seat belt tensioner or another element for installation in a vehicle, which increases a safety or a protection of an occupant of the vehicle in the event of an accident. A road user protection device may be a device, for example, which protects a road user situated outside the vehicle. For example, such a road user may be a pedestrian, a bicyclist, a motorcyclist or the like. In particular, such a road user may be understood to mean an inferior road user that is weaker or more vulnerable in relation to a vehicle, such as a passenger car, a truck or, in general terms, a multitrack vehicle, for example. For example, such a road user protection device may include an outside airbag, an engine cover pop-up device or the like, to increase the protection of the road user during an impact with the vehicle. Such a specific embodiment of the present invention offers the advantage that an operating safety of the occupant protection device is implementable by a warning prior to a drop in a supply voltage of the occupant protection device, in particular when the monitoring signal is used to control an operation or a function of the occupant protection device.

The present invention is described in greater detail hereafter based on the accompanying drawings by way of example.

In the following description of exemplary embodiments of the present invention, identical or similar reference numerals are used for similarly acting elements shown in the different figures, and a repeated description of these elements is dispensed with.

DETAILED DESCRIPTION

Figure 1A:
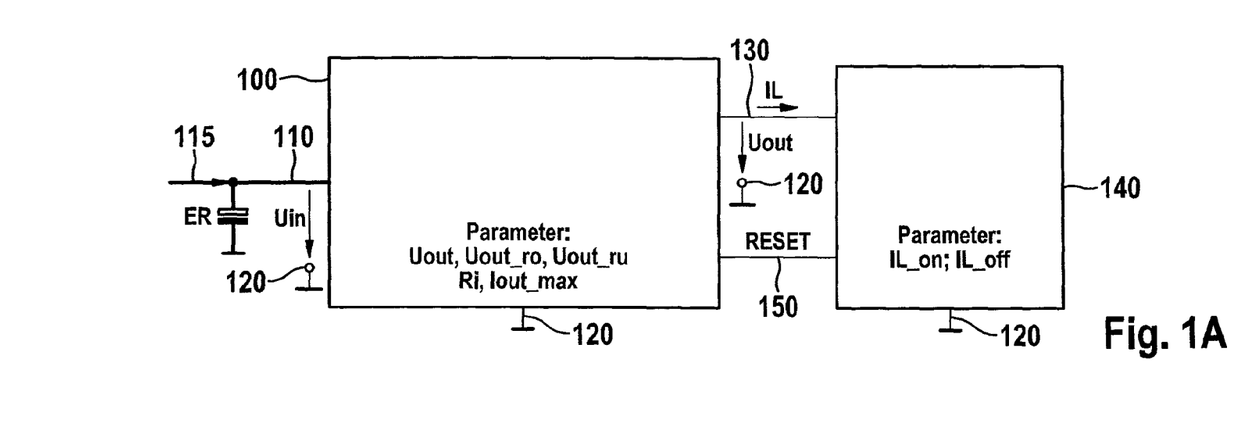
FIG. 1A shows a circuit diagram of an energy supply unit for a consumer.

To explain the underlying problem of the approach described here, FIG. 1A shows a circuit diagram of a voltage regulator 100 which is buffered by an energy reserve ER and configured as a p-type MOSFET voltage regulator having RESET monitoring and current limiting. Voltage regulator 100 is supplied with energy from an energy reserve ER, for example a capacitor, at an input 110, energy reserve ER being charged by an energy supply network 115 and autonomously supplying the voltage regulator 100 after a decoupling of energy supply network 115. Moreover, an input voltage Uin drops between input 110 and a reference potential 120, which here is a ground potential. A regulated voltage Uout (relative to reference potential 120) is output at an output 130 of voltage regulator 100 at an output current IL, which represents an overall current which may be made available to a sum of consumers 140 by voltage regulator 100. Consumers 140 are all controllable by a RESET signal, which is output by voltage regulator 100 as monitoring signal 150. In the following description the terms monitoring signal, RESET, RESET signal and RESET state are used, these terms with regard to their content being understood to mean signal or value of the monitoring signal, depending on the context.

As is apparent from the diagrams of FIG. 1B, the system shown in FIG. 1A behaves as follows in the autonomy case, i.e., when energy supply network 115 is decoupled:

Input voltage Uin of voltage regulator 100 drops, a load current-dependent voltage drop across voltage regulator 100 also being noticeable when the same leaves the control range due to internal resistance Ri of voltage regulator 100 with (flowing) current IL_on. Starting at point in time t2, in this way output voltage Uout will drop with a voltage difference Udrop in relation to input voltage Uin. At point in time t3, the output voltage will have crossed a gap 160 between control voltage Uout_reg, which is actually aspired by voltage regulator 100, and a (minimal) undervoltage limit at output 130. Output voltage Uout of voltage regulator 100 thus leaves the control range as soon as $$U\text{in} < U\text{out\_reg} + Ri \times IL\_\text{on applies.}$$

For example, output voltage Uout leaves the control range at IL=1A, Ri=1 ohm and Uout_reg=6.7 V starting at Uin<7.7 V, where Ri denotes the internal resistance of the p-channel MOSFET regulator 100, and IL_on denotes the sum of the consumption currents IL at regulator output 130 during an inactive monitoring signal.

Input voltage Uin of regulator 100 may decrease further until output voltage Uout reaches lower voltage monitoring limit Uout_ru of control output voltage Uout. Then an active low RESET signal is generated to prevent or preclude an operation and/or a function of consumer or consumers 140, so that then only a current IL_off flows across output 130. The following applies, for example, to the RESET undervoltage limit: Uout_ru =Uout reg−200 mV.

The input condition of the regulator for the RESET activation may be described as follows:

$$U\text{in(reset)} = U\text{out\_}ru + IL\_\text{on} \times Ri = U\text{out\_reg} - 200 \text{ mV} + 1$$
$$V = 7.5 \text{ V}$$

When the monitoring signal is activated (i.e., the RESET takes effect), this has a synchronous reaction on load currents IL of regulator 100. If the load current during an active monitoring signal=RESET $$IL\_\text{off} = k \times IL\_\text{on} (k=0 \ldots 1), \text{ e.g., } 0.5 \times IL\_\text{on},$$

a voltage increase directly follows with the RESET at regulator output 130.

Theoretically, this voltage increase is Ri×(IL_on−IL_off); for the above example, the voltage increase amount is 0.5 V. The increase, however, is limited by the regulator to control voltage Uout_reg.

Figure 1B:
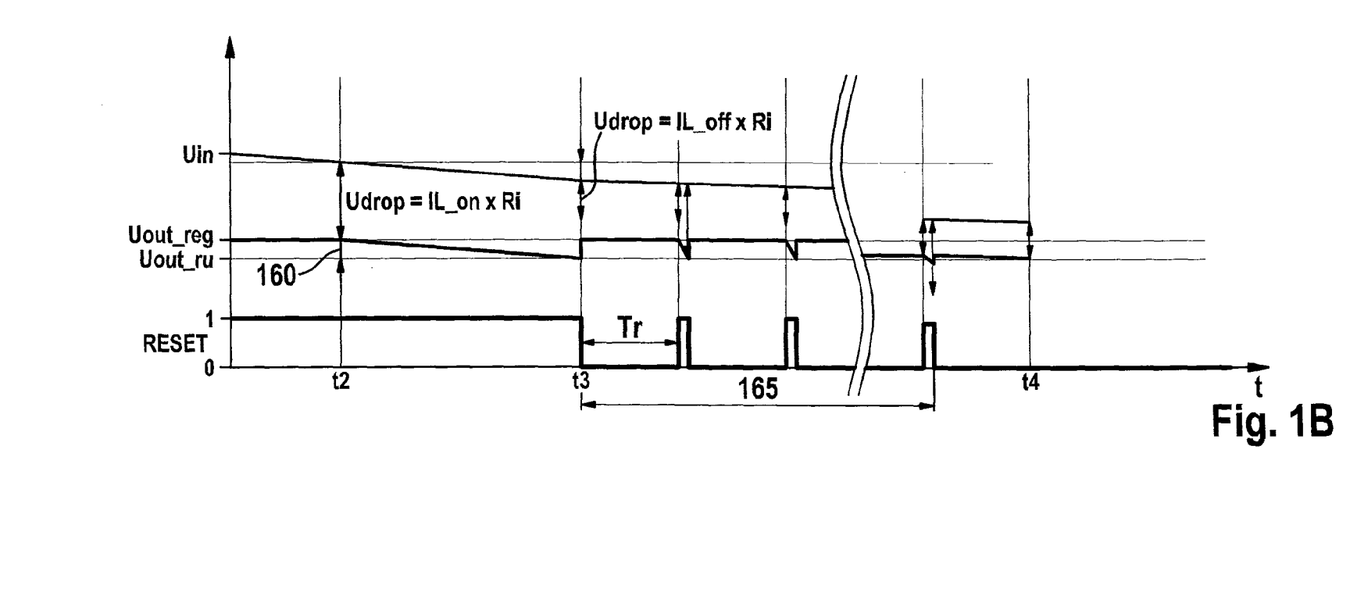
FIG. 1B shows diagrams of signals of an energy supply unit configured according to FIG. 1A over a period of time.

In the illustration of FIG. 1B, the RESET condition is thus synchronously already suspended again as soon as it occurs (i.e., the activation condition for the monitoring signal RESET), and the RESET state is only maintained to a limited extent by the RESET duration Tr now elapsing. Input voltage Uin decreases during this time as well, since no new energy from the vehicle supply system in the form of the energy supply network is supplied to energy reserve ER, and the same should now cover load current IL_off.

If, at the end of RESET monoflop time Tr, input voltage Uin of voltage regulator 100 has been reduced to the condition $$U\text{in(duration\_reset)} = U\text{out\_}ru + IL\_\text{off} \times Ri$$

(7 V in the example), monitoring signal RESET remains permanently active (point in time t4); otherwise the system is re-enabled and reset again. As shown in the diagrams of FIG. 1B, this results in repeated RESET inactive/active states (also referred to as RESET pulses), as is apparent in time period 165.

An important aspect of the approach described here may be seen in preventing the occurrence of multiple RESET pulses in buffered systems as a result of a regulator current IL which is synchronously reduced with the triggered RESET. In this way instabilities during the deactivation of restraint systems such as airbags, or their control units, as consumers 140 are avoided since the renewed RESET enable takes place in particular in a range of a non-regulated voltage change of regulator output 130 (range between undervoltage RESET threshold Uout_ru and control voltage Uout_reg).

The approach described here should thus make a stable RESET definition (i.e., a stable activation definition for activating monitoring signal RESET) possible, even with regulator output current IL dropping synchronously with the active RESET.

The approach introduced here provides for a voltage regulator 100 which is buffered by energy reserve ER and has overvoltage and undervoltage monitoring of the output voltage and additional threshold monitoring of the control input voltage in such a way that, when an excessively low output voltage Uout_ur (=lower guaranteed voltage at which all connected consumers 140 still function fully according to specification) occurs, this state is stored when additionally the control input voltage is also lower than Uin_min (=lower guaranteed control input voltage Uin at which regulator 100 is still able to provide nominal output voltage Uout under full current load IL (=Iout max) according to specification).

Figure 2A:
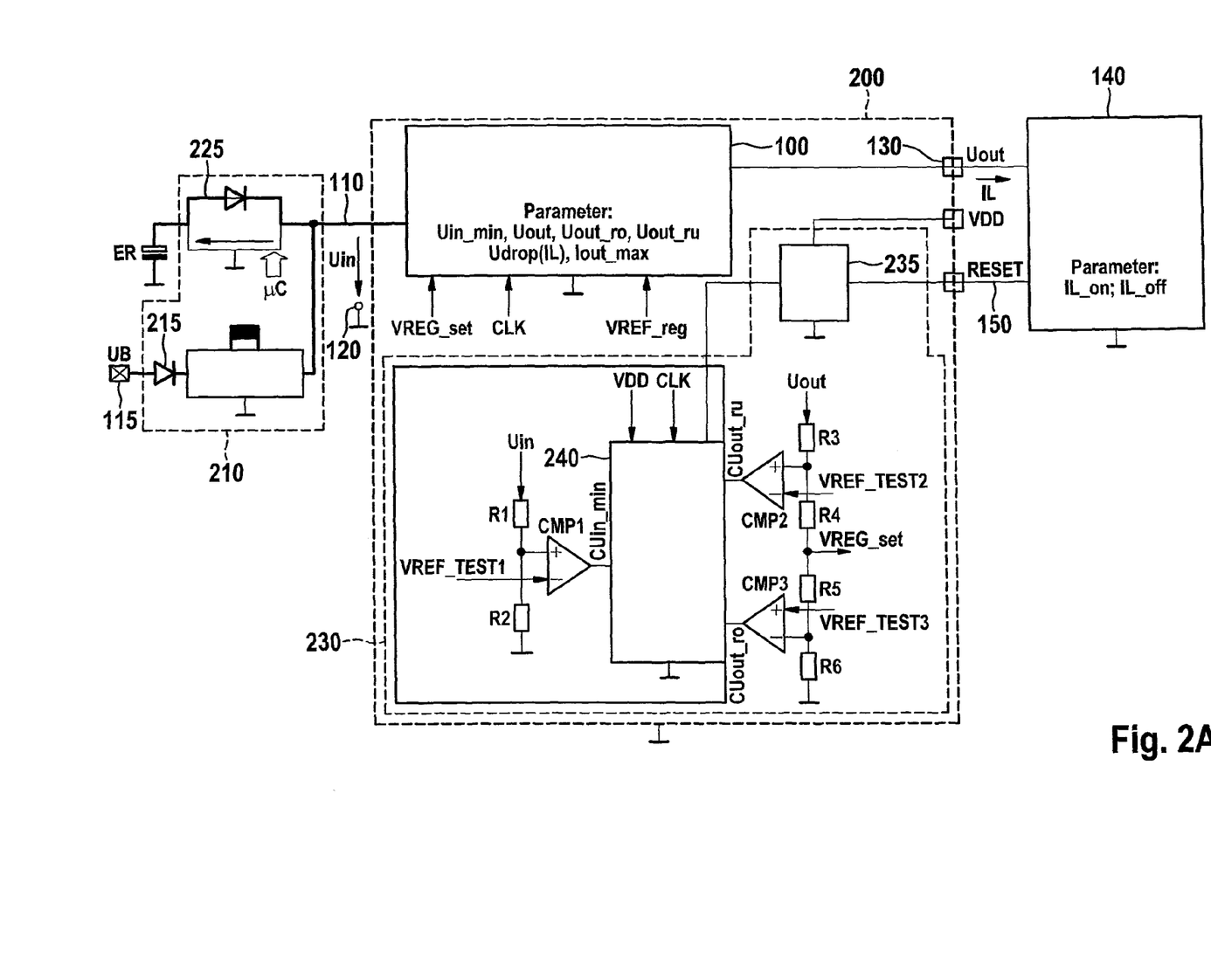
FIG. 2A shows a circuit diagram of an energy supply unit for a consumer according to one exemplary embodiment of the present invention.

FIG. 2A shows a circuit diagram of a voltage regulator 100 which is buffered by an energy reserve and has load current-independent RESET generation in accordance with the approach described here. Voltage regulator 100 forms part of an energy supply unit, which furthermore includes energy reserve ER and a monitoring unit 200, which is configured to output monitoring signal RESET. The input of energy supply unit 200, which also forms the input of voltage regulator 100 (which may also be referred to as energy supply controller), is connected via a supply circuit 210 to energy reserve ER and energy supply network 115, a rectification element 215 conducting electric energy from energy supply network 115 to an up converter circuit 220, which in turn is connected to input 110 of voltage regulator 100. Moreover, additionally a microcontroller (μC) controlled charging circuit 225 having a controllable current flow connects up converter 220 to energy reserve ER (during charging operation). In addition, a diode (anode at energy reserve ER) electrically connects the energy reserve to input 110 for power delivery in the autonomy case. The output of energy supply unit 200, which is also the output of voltage regulator 100, is again connected to consumer(s) 140.

Contrary to voltage regulator 100 as it was shown in FIG. 1A, monitoring signal 150 (RESET) is now supplied by monitoring unit 230 using a driver 235. Monitoring unit 230 monitors input voltage Uin and output voltage Uout, and based thereon ascertains different intermediate signals, which are used to ascertain monitoring signal RESET. For example, a first intermediate signal CUin_min is ascertained by applying input voltage Uin to a voltage divider having resistors R1 and R2, the tapping point between resistors R1 and R2 being connected in an electrically conducting manner to a non-inverting input of a first comparator CMP1. The inverting input of first comparator CMP1 is connected to a first reference voltage VREF_TEST1, which together with the divider ratio (R1+R2)/R2) corresponds, for example, to the reset threshold value described in greater detail hereafter (=VREF_TEST1*(R1+R2)/R2). First intermediate signal CUin_min may then be tapped at the output of first comparator CMP1, the intermediate signal having a high signal level (i.e., a logic "1") when input voltage Uin is greater than the reset threshold value.

Output voltage Uout is applied across a voltage divider having the four resistors R3, R4, R5 and R6 connected in series. The tapping point between resistors R3 and R4 is connected in an electrically conducting manner to a non-inverting input of a second comparator CMP2. The inverting input of second comparator CMP2 is connected to a second reference voltage VREF_TEST2, a second intermediate signal CUout_ru being tappable at an output of second comparator CMP2. Second intermediate signal CUout_ru may then be tapped at the output of second comparator CMP2, the intermediate signal having a high signal level (i.e., a logic "1") when output voltage Uout of the regulator is greater than a lower still permissible limiting value (Uout_ru).

The tapping point between resistors R5 and R6 is connected in an electrically conducting manner to an inverting input of a third comparator CMP3. The non-inverting input of third comparator CMP3 is connected to a third reference voltage VREF_TEST3, a third intermediate signal CUout_ro being tappable at an output of third comparator CMP3.

Second intermediate signal CUout_ro may then be tapped at the output of third comparator CMP3, the intermediate signal having a high signal level (i.e., a logic "1") when output voltage Uout of the regulator is lower than an upper still permissible limiting value (Uout_ro).

First, second and third reference voltages VREF_TEST1, VREF_TEST2 and VREF_TEST3 may also assume identical values.

A fourth intermediate signal VREG_set may be tapped at a tapping point between resistors R4 and R5.

In addition to a supply voltage VDD and a clock signal CLK, first intermediate signal CUin_min, second intermediate signal CUout_ru and third intermediate signal CUout_ro are now made available to a digital circuit 240, which includes one or multiple logic elements, counters, flip flops or the like, for example, in order to be able to provide monitoring signal RESET amplified by driver 235, as is described in greater detail hereafter.

To further explain the operating mode of monitoring unit 230, the following signals should be addressed in greater detail:

VREF_TEST (i.e., VREF_TEST1, VREF_TEST2 and VREF_TEST3) summarize/summarizes one or multiple reference voltage level(s) for voltage monitoring here. These are generated from Uin in the case of separate voltage regulators, or from a suitable system voltage in the case of integrated system modules, with the aid of a prestabilization using a band gap, which will not be addressed in greater detail in this description.

Variable CLK in the present invention denotes a clock signal for generating a necessary regulator clock (if a switching regulator is used) and for generating a defined RESET follow-up time during the transition of the regulator output and input conditions into the "GOOD" state or for generating filter times.

Designation VDD represents an auxiliary voltage to supply logic circuit 240.

Variable VREG_set denotes a regulator feedback voltage (actual value of Uout).

Variable VREF_REG denotes a reference voltage for voltage regulation. It is generated from Uin in the case of separate voltage regulators, or from a suitable system voltage in the case of integrated system modules, with the aid of a prestabilization using a band gap, which will not be addressed in greater detail in this description.

In particular elements R1, R2, CMP1, Uin and VREF_test describe a circuit for monitoring of voltage Uin for a defined threshold (Uin_min) at which CUin_min="high" applies when Uin>Uin_min, and CUin_min="low" applies when Uin<=Uin_min.

Figure 2B:
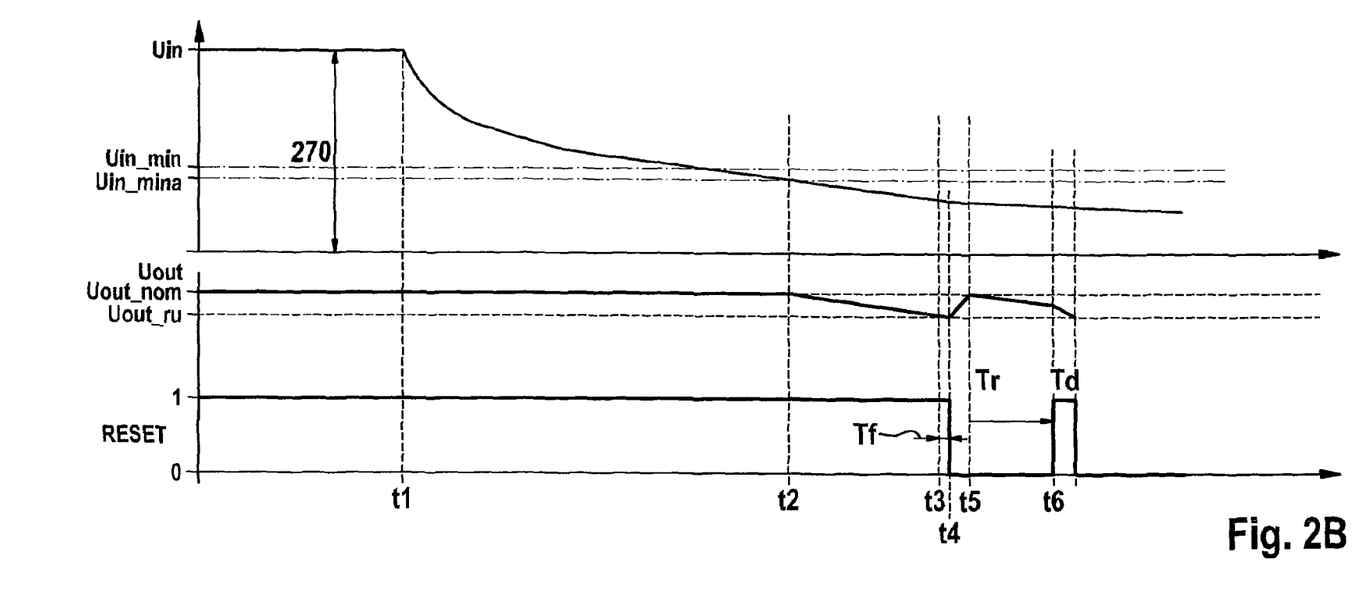
FIG. 2B shows diagrams of signals of an energy supply unit configured according to FIG. 2A corresponding to one exemplary embodiment of the present invention.

FIG. 2B shows diagrams of signal characteristics of individual signals which are illustrated in the circuit diagram of FIG. 2A. In particular the chronological progression of input voltage Uin, the chronological progression of output voltage Uout, and the chronological progression of monitoring signal RESET are illustrated.

At a first point in time ti, a start of the decreasing supply of a buffered regulator (proceeding from a state 270 of the normal supply by the energy supply network) takes place, for example, in the case of incipient autonomy. At second point in time t2, input voltage Uin drops below an individual threshold Uin_mina (application) (which is dependent on regulator internal resistance Ri and a load level present at regulator 100), at which it is no longer possible to maintain output voltage Uout at regulated value Uout_nom (nominal). Starting at third point in time t3, output voltage Uout drops below the value Uout_ru, and thus the threshold at which monitoring signal RESET is triggered after a filter time Tf (i.e., a signal change of the monitoring signal to the "low" state occurs). At a fourth point in time t4, monitoring signal RESET is triggered (i.e., activated and in the "low" state), and the current load of the regulator is reduced from IL_on to IL_off, whereby at a lower regulator drop output voltage Uout rises (or may rise, dependent on the application) again to nominal regulator voltage Uout_nom. At a fifth point in time t5, RESET follow-up time Tr is triggered by the restoration of a regulator voltage greater than Uout_ru, and the RESET is enabled again at point in time t6 with a small decrease in input voltage Uin due to a drastically reduced load. At point in time t6, logic monoflop time Tr (i.e., the RESET follow-up time) has lapsed and the RESET is enabled again. The reduced load current is increased to the nominal current with delay for the regulator (coverage from the output capacitor of the regulator), whereby the drop across the regulator increases and RESET conditions as at point in time t3 arise. These processes repeat until no Uin≤Uout_ru+Udrop@IL_off.

Figure 2C:
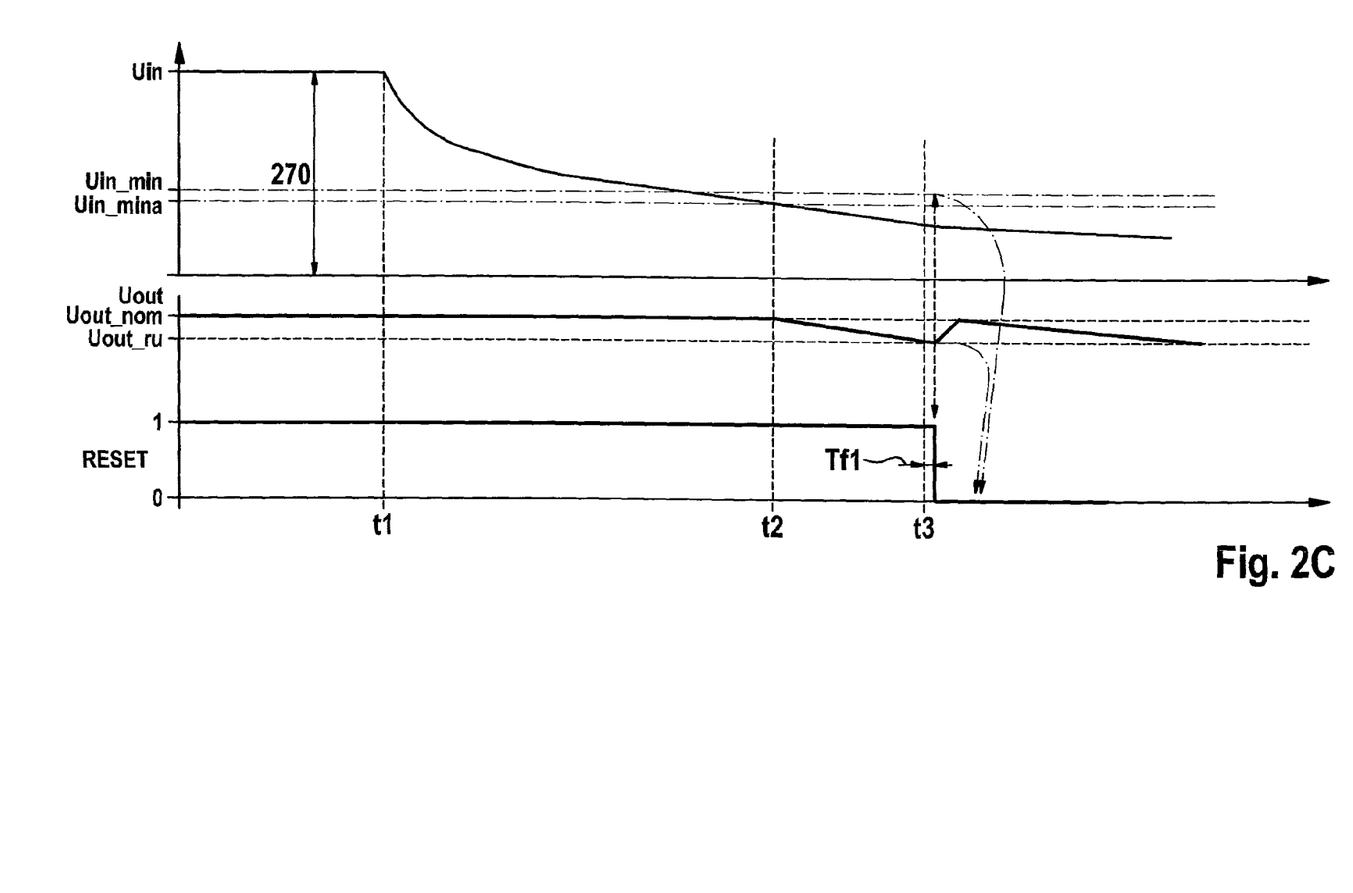
FIG. 2C shows diagrams of further signals of an energy supply unit configured according to FIG. 2A corresponding to one exemplary embodiment of the present invention.

FIG. 2C shows further flow charts of signal level values of the input voltage, the output voltage and the monitoring signal as features of the energy supply unit described here. According to one exemplary embodiment of the present invention, the following is now newly provided in RESET logic circuit 240 according to circuit diagram of FIG. 2A. If an undervoltage is identified in output voltage Uout at point in time t3 (i.e., =CUout_ru=0 or "low"), this state is stored after a filter time (Tf1>=0), if at this point in time the newly added monitoring of input voltage Uin also indicates an excessively low input voltage (i.e., CUin_min=0; Uin<=Uin_min). This stored undervoltage reset condition remains effective until input voltage Uin no longer exceeds the value Uin_min. If the input voltage is increased beyond Uin_min, the stored value in the RESET logic circuit for the formation of monitoring signal RESET is reset or deactivated.

The RESET condition (monitoring signal RESET) now again depends solely on the monitoring of output voltage Uout. If output voltage Uout is within the monitoring band (CUout_ru=1; CUout_ro=1), a monoflop (also digital element, counter etc.) is triggered for the RESET follow-up time generation. When the follow-up time has lapsed, the RESET signal is set to "not active," i.e., to a logic "1." This means that the new monitoring of input voltage Uin plays only a role when the RESET signal identifies a fault as a result of the undervoltage at regulator output 130. The "active" state of undervoltage reset signal RESET (i.e., of the monitoring signal) is then stored as soon as input voltage Uin of regulator 130 also becomes lower than would be necessary to generate a correct output voltage Uout under full current load IL_max. The stored state in the RESET logic circuit for the formation of monitoring signal RESET "active" (=excessively low control input voltage Uin<Uinmin and excessively low control output voltage Uout<Uout_ru) is again suspended immediately or after filtration as soon as input voltage Uin becomes greater than Uin_min. This results in no disadvantages when starting a previously unsupplied regulator.

Figures 3A, 3B:
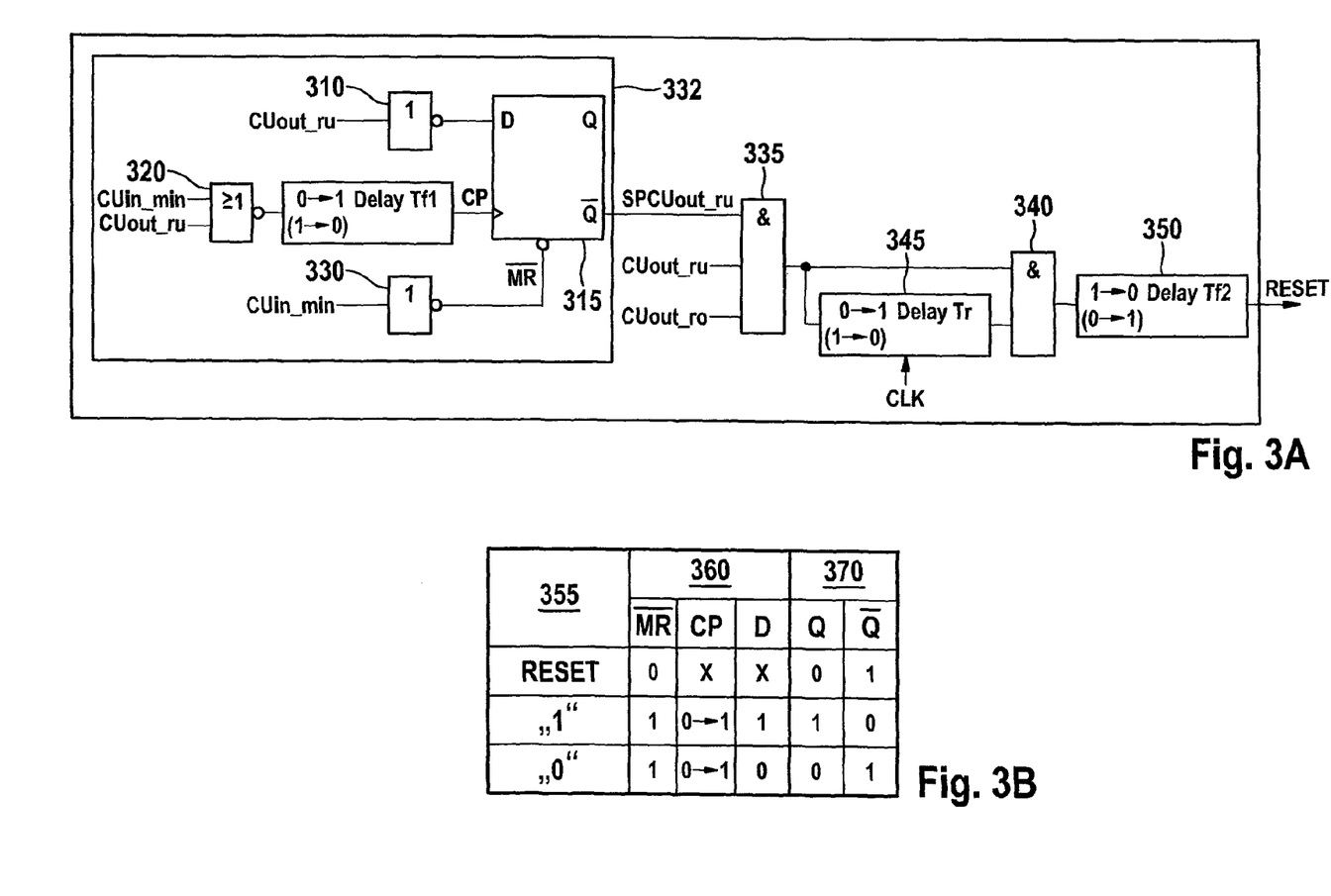
FIG. 3A shows a circuit diagram of one exemplary embodiment of a monitoring unit for use in an energy supply unit for a consumer.
FIG. 3B shows a table which reflects a correlation between input variables and output variables of a monitoring unit configured according to FIG. 3A.

FIG. 3A shows a circuit diagram of one exemplary embodiment of a monitoring unit 230 for use in an energy supply unit according to one exemplary embodiment of the present invention. It is apparent from the circuit diagram of FIG. 3A that, according to this exemplary embodiment of the present invention, second intermediate signal CUout_ru is inverted with the aid of an inverter 310, and inverted intermediate signal CUout_ru is then supplied to a D input of a D flip flop 315. First intermediate signal CUin_min and second intermediate signal CUout_ru are supplied in each case to an input of a NOR gate 320, the output signal of NOR gate 320 being conducted into a first delay unit 325, in which a signal CP is output delayed by a time period Tf1 during a change in a signal level of a logic 0 to a logic 1, while no delay of the signal change in signal CP occurs during a signal change from a logic 1 to a logic 0. Signal CP is applied to the clock input of D flip flop 315 and is used to clock D flip flop 315. First intermediate signal CUin_min is furthermore supplied to a second inverter 330, which applies inverted first intermediate signal CUin_min as a reset signal $\overline{MR}$ to a reset signal input of D flip flop 315. Inverter 310, D flip flop 315, NOR gate 320, first delay unit 325 and second inverter 330 form a logic circuit 332, which supplies a logic signal SPCUout_ru. This logic signal SPCUout_ru is tappable at inverted output $\overline{Q}$ and is supplied to a respective input of an AND gate 335, in addition to second and third intermediate signals CUout_ru and CUout_ro. The output of AND gate 335 is connected to a first input of a second AND gate 340, a signal level of an output of a second delay element 345 clocked by a clock signal CLK being supplied to the second input of second AND gate 340. This second delay element 345 delays a signal at the output of AND gate 335 by a time period Tr when a change in the level at the output of AND gate 335 occurs from a value of a logic 0 to a logic 1, and the signal not being delayed at the output of AND gate 335 when a change in the level at the output of AND gate 335 occurs from a value of a logic 1 to a logic 0. A signal which is tappable at the output of further AND gate 340 is then delayed by a time period Tf2, using a third delay unit 350, when a change in the level at the output of third AND gate 350 occurs from a value of a logic 1 to a logic 0, and the signal not being delayed at the output of third AND gate 350 when a change in the level at the output of third AND gate 350 occurs from a value of a logic 0 to a logic 1. The signal output by third delay unit 350 may then be understood as monitoring signal RESET, which is amplified by driver 235 and output to corresponding consumers 140.

Taking the following correlations into consideration
Uout>Uout_ru→CUout_ru=1
Uout≤Uout_ru→CUout_ru=0
Uout≥Uout_ro→CUout_ro=0
Uout<Uout_ro→CUout_ro=1
Uin>Uin_min→CUin_min=1
Uin≤Uin_min→CUin_min=0
RESET=0→reset active
RESET=1→reset inactive the correlations shown in the table of FIG. 3B apply to the aspired function 355, inputs 360 of D flip flop 315, and outputs 370 of D flip flop 315.

Figure 3C:
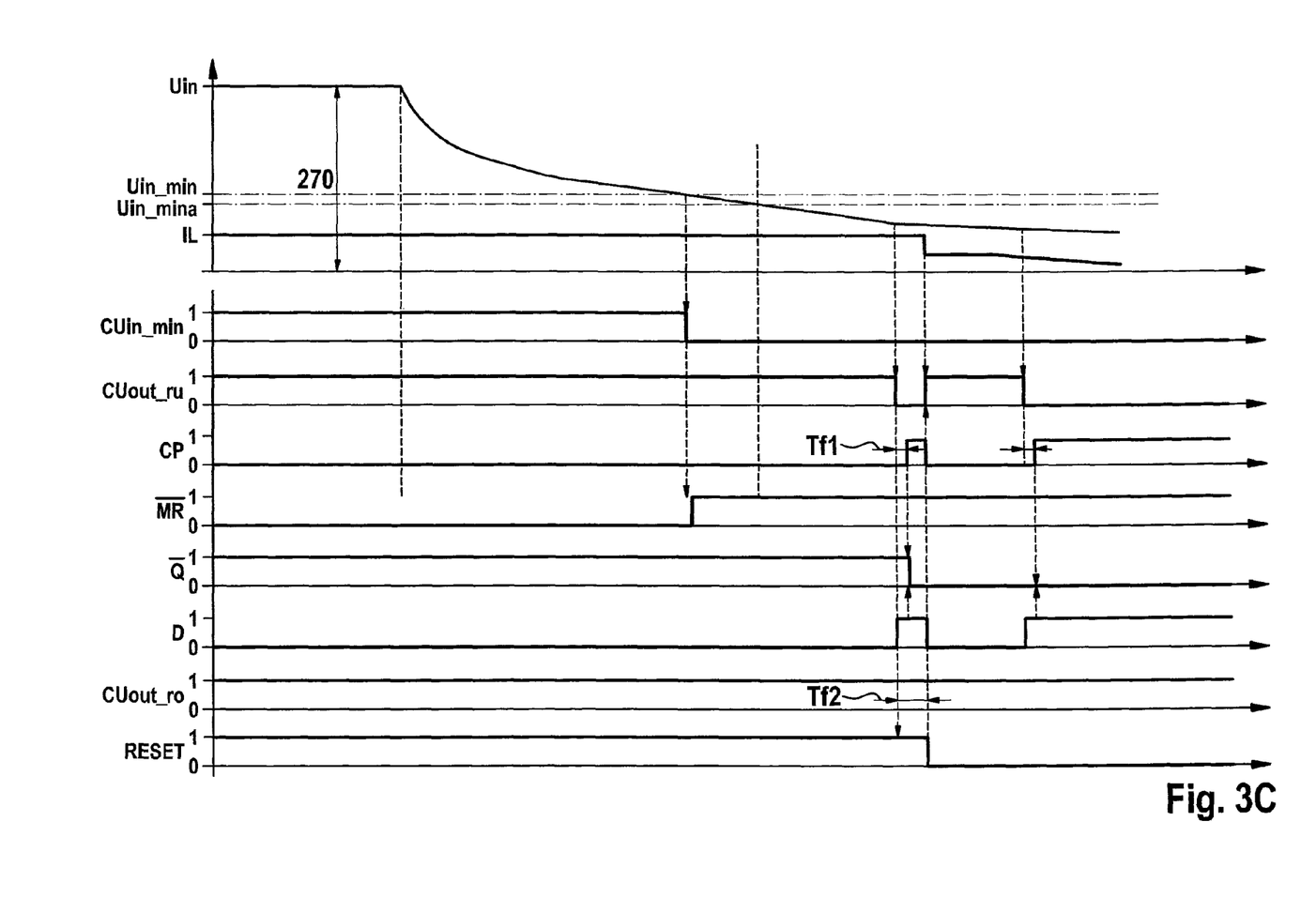
FIG. 3C shows diagrams of further signals using a monitoring unit configured according to FIG. 3A corresponding to one exemplary embodiment of the present invention.

FIG. 3C shows flow charts for signal levels of signals Uin, CUin_min, CUout_ru, CP, $\overline{MR}$, $\overline{Q}$ D, CUout_ro and RESET, which result for a configuration and interconnection of components in accordance with the illustration of FIG. 3A.

Figure 4A:
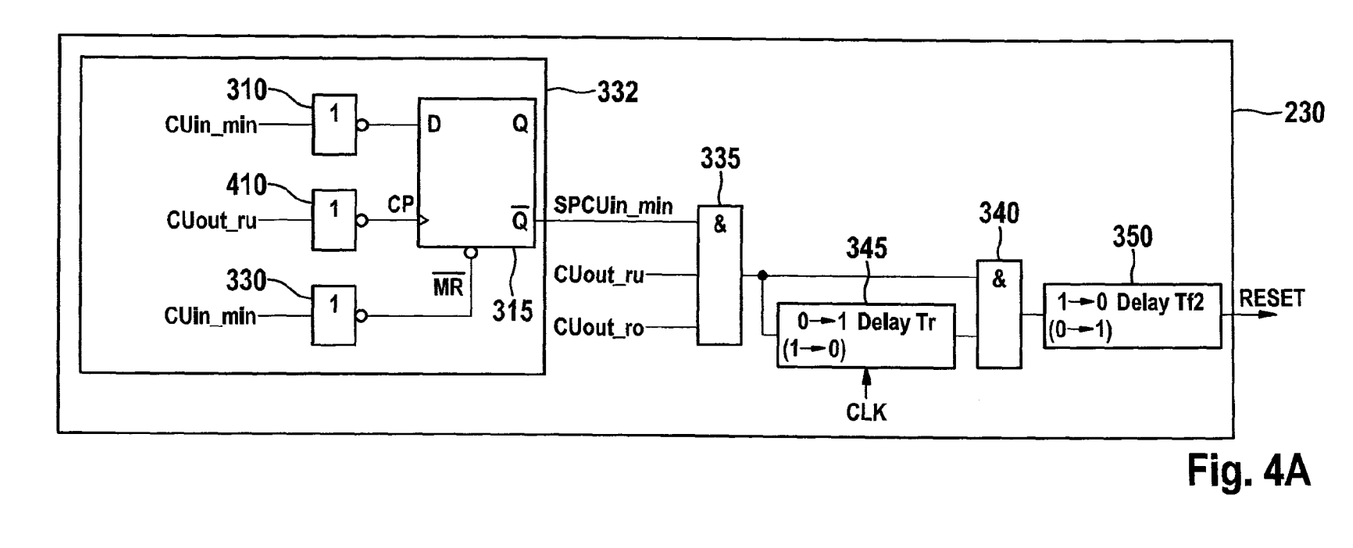
FIG. 4A shows a circuit diagram of a further exemplary embodiment of a monitoring unit for use in an energy supply unit for a consumer.

FIG. 4A shows a circuit diagram of one further exemplary embodiment for a monitoring unit 230 for use in one exemplary embodiment of an energy supply unit. Contrary to the circuit diagram of the exemplary embodiment of monitoring unit 230 shown in FIG. 3A, the logic unit/circuit 332 is configured differently. In particular, first intermediate signal CUin_min is now inverted by first inverter 310 and supplied to the D input of D flip flop 315. Moreover, second intermediate signal CUout_ru is inverted by a further inverter 410 and supplied as a clock signal to the clock input of D flip flop 315. The signal output by logic circuit 332, which is now referred to as SPCUnin_min and represents a status signal for monitoring the input voltage, is now supplied together with the second and third intermediate signal to a respective input of AND gate 335.

Taking the following correlations into consideration
Uout>Uout_ru→CUout_ru=1
Uout≤Uout_ru→CUout_ru=0
Uout≥Uout_ro→CUout_ro=0

Figure 4B:
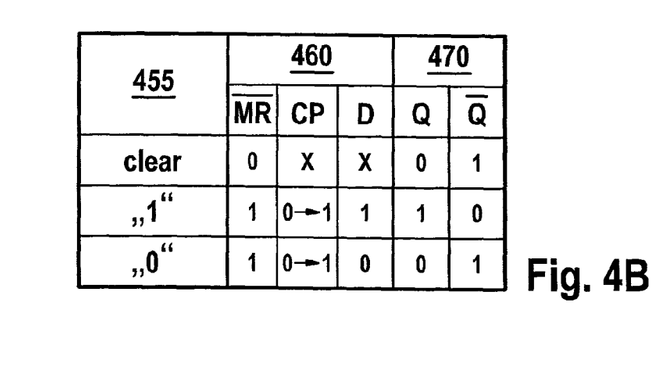
FIG. 4B shows a table which reflects a correlation between input variables and output variables of a monitoring unit configured according to FIG. 4A.

Uout<Uout_ro→CUout_ro=1
Uin>Uin_min→CUin_min=1
Uin≤Uin_min→CUin_min=0
RESET=0→reset active
RESET=1→reset inactive the correlations shown in the table of FIG. 4B now apply to the aspired function 455 for the RESET state, inputs 460 of D flip flop 315, and outputs 470 of D flip flop 315.

Figure 4C:
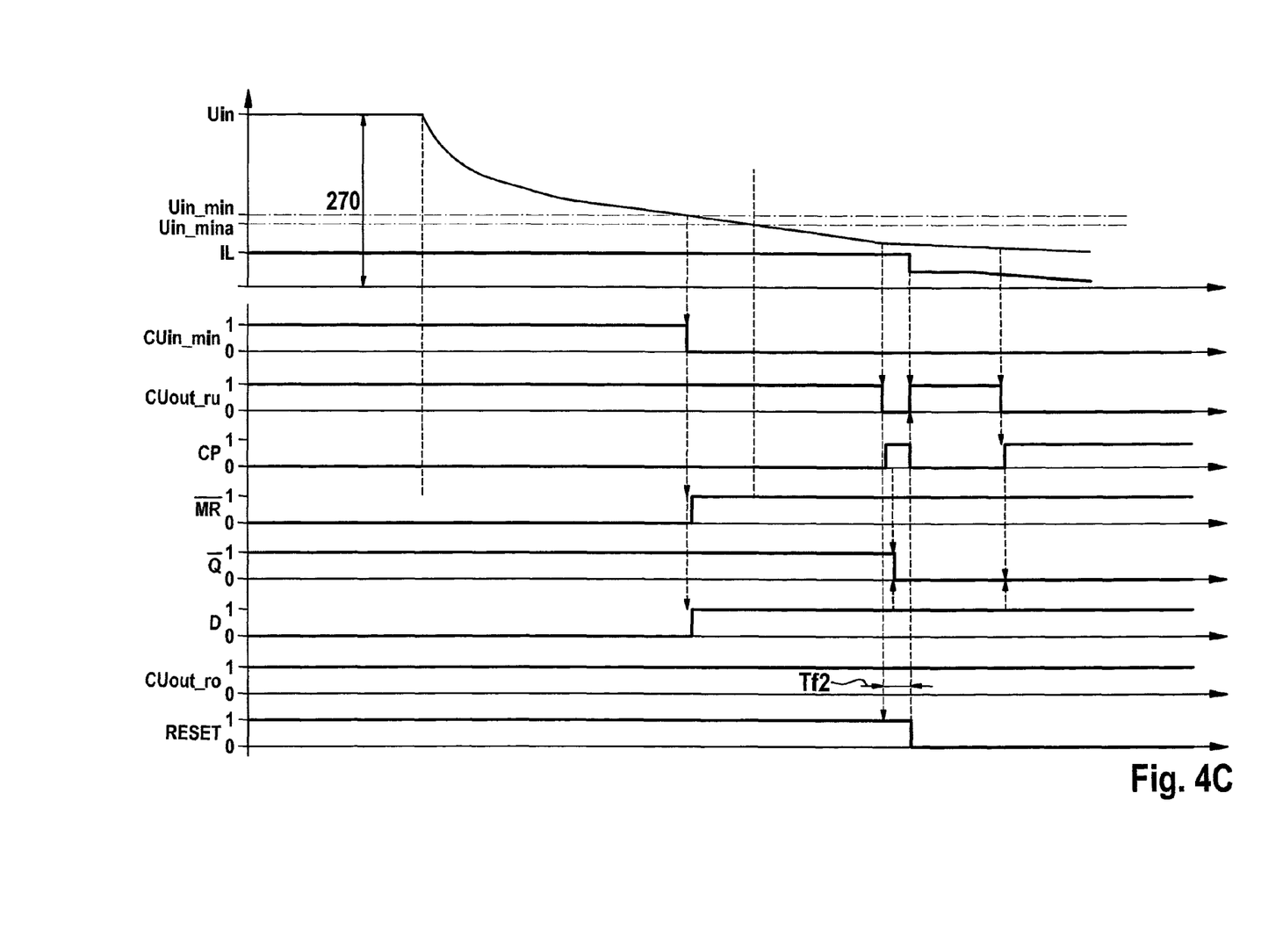
FIG. 4C shows diagrams of further signals using a monitoring unit configured according to FIG. 4A corresponding to one exemplary embodiment of the present invention.

FIG. 4C shows flow charts for signal levels of signals Uin, CUin_min, CUout_ru, CP, $\overline{MR},\overline{Q}$ D, CUout_ro and RESET, which result for a configuration and interconnection of components in accordance with the illustration of FIG. 4A.

Figure 5:
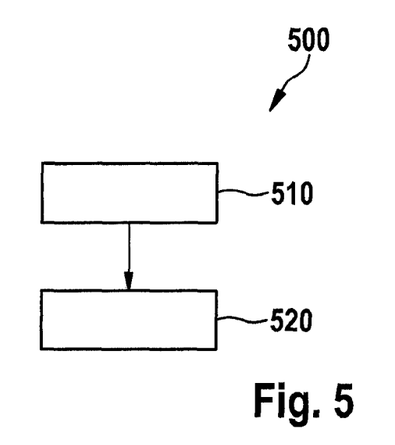
FIG. 5 shows a flow chart of a method according to one exemplary embodiment of the present invention.

FIG. 5 shows a flow chart of one exemplary embodiment of the present invention as method 500 for operating an energy supply unit according to an above-described variant for the autonomous supply of a consumer. Method 500 includes a step 510 of setting the monitoring signal to an active state when an output voltage present between the output and a reference potential is lower than a predefined activation threshold value. Method 500 moreover includes a step 520 of bringing the monitoring signal into an inactive state when an input voltage present between the input and the reference potential has risen again above a reset threshold value.

In summary, it should be noted that the state stored in logic circuit 332 (Uout<=Uout_ru)=SPCUout_ru (active in "0" for a configuration of the logic circuit 332 in accordance with the circuit diagram of FIG. 3A) controls the external RESET state to active (e.g., illustrated by a logic "0"). The state SPCUout_ru stored by the logic circuit 332 is not directly dependent on output voltage Uout. If control output voltage Uout again exceeds limit Uout_ru, SPCUout_ru does not necessarily change; i.e., RESET active (="0") is output even with a correct output voltage Uout of regulator 100.

This is maintained in a stable manner until input voltage Uin of regulator 110 again exceeds limit Uin_min. If this occurs, the stored state is set to inactive (i.e., no influence on the RESET exists any longer; SPCUout_ru is thus independent of Uout). If at this point in time output voltage Uout<=Uout_ru, the external RESET output is maintained at active ("0") in a stable manner. If output voltage Uout exceeds limit Uout_ur, or had already exceeded the same, RESET output 150 is maintained at active (i.e., "0") only for a RESET follow-up time Tr. If the RESET is in the inactive state (i.e., "high") and SPCUout_ru (inactive, i.e., "1" in an interconnection according to the illustration of FIG. 3A), the monitoring of input voltage Uin of regulator 100 does not play a role. This has the advantage that, in the autonomy case, the decreasing control input voltage Uin is not dependent on a predefined limit, but the RESET arises based on the individual regulator and load parameters which cause a drop across regulator 100, which leads to a drop below a limit based on output 130.

In this way, energy reserve ER is used individually to the lowest Uin limit. No changes occur during a start of the system, or on the contrary, the reset follow-up time may be kept short since it is no longer important to prevent multiple RESET processes. Input voltage Uin of regulator 100 is quickly (<2 ms) brought to voltages of 20 V to 35 V by a step-up converter (up converter according to FIG. 2a), independently of the ER voltage. This has the advantage that no extended waiting period results from an event in which the worst case input voltage Uin of regulator 100 for outputting a correct output voltage Uout under full load (ILmax) exceeds Uin_min, which is necessary for the RESET enable at the start (RESET is already "low active" since no output voltage is present). Furthermore, the approach is also suitable for voltage regulators having N-channel MOSFETS or NPN transistors.

The described exemplary embodiments shown in the figures are selected only by way of example. Different exemplary embodiments may be combined with each other completely or with respect to individual features. It is also possible to supplement one exemplary embodiment with features of another exemplary embodiment.

Moreover, method steps according to the present invention may be carried out repeatedly and in a different order than the one described.

If one exemplary embodiment includes an "and/or" linkage between a first feature and a second feature, this should be read in such a way that the exemplary embodiment according to one specific embodiment includes both the first feature and the second feature, and according to an additional specific embodiment includes either only the first feature or only the second feature.

What is claimed is:

1. An energy supply unit for autonomously supplying a consumer, comprising:
    an energy store to supply electric energy to a consumer when the electrical consumer is decoupled from an energy supply network;
    an energy supply controller having an input coupled to the energy store for receiving electric energy and an output for delivering electric energy to the consumer; and
    a monitoring unit for outputting a monitoring signal, and configured to set the monitoring signal to an active state when an output voltage present between the output and a reference potential is lower than a predefined first activation threshold value or greater than a predefined second activation threshold value, and being configured to reset the monitoring signal to an inactive state when an input voltage present between the input and the reference potential again rises above or is above a reset threshold value.

2. The energy supply unit of claim 1, wherein the monitoring unit is configured to maintain the monitoring signal in the active state, independently of control output voltage monitoring, if the input voltage is lower than a third activation threshold value and/or the output voltage is lower than the first activation threshold value one time or for a certain time window.

3. The energy supply unit of claim 1, wherein the monitoring unit is configured to switch the monitoring signal to the active state when the input voltage is lower than a third activation threshold value.

4. The energy supply unit of claim 1, wherein the monitoring unit is configured to switch the monitoring signal to the inactive state if the input voltage is greater than or equal to a predefined reset threshold value.

5. The energy supply unit of claim 1, wherein the monitoring unit includes at least one digital circuit, including a logic circuit, to generate the monitoring signal.

6. The energy supply unit of claim 1, wherein the monitoring unit includes at least one digital circuit, including a logic circuit, to be clocked with a continuous digital clock signal to determine at least one follow-up time during which a filter and/or the monitoring signal is maintained in the active state.

7. The energy supply unit of claim 1, wherein the monitoring unit includes one or multiple resettable flip flop elements, including of the D flip flop type, to generate the monitoring signal.

8. The energy supply unit of claim 1, wherein the monitoring unit includes at least one resettable flip flop element, which is resettable as a function of the input voltage.

9. The energy supply unit of claim 1, wherein the monitoring unit includes at least one resettable flip flop element, which is clockable as a function of the output voltage) and/or the input voltage.

10. The energy supply unit of claim 1, wherein the monitoring unit is configured to delay the output of the monitoring signal in the second state during a change of the monitoring signal from a first state to a second state, and not to delay the output of the monitoring signal in the first state during a change of the monitoring signal from the second state to the first state.

11. The energy supply unit of claim 1, wherein the monitoring unit is configured to maintain the monitoring signal in the active state, independently of control output voltage monitoring, if the input voltage is lower than a third activation threshold value and/or the output voltage is lower than the first activation threshold value one time or for a certain time window, the third activation threshold value being identical to the reset threshold value.

12. The energy supply unit of claim 1, wherein the monitoring unit is configured to switch the monitoring signal to the active state when the input voltage is lower than a third activation threshold value, independently of control output voltage monitoring, if the input voltage is lower than the third activation threshold value, the third activation threshold value being selected so that the output voltage of the energy supply controller does not leave a regulated voltage range of the output voltage, even under full current load, up to a voltage value which corresponds to the third activation threshold value.

13. The energy supply unit of claim 1, wherein the monitoring unit is configured to switch the monitoring signal to the inactive state if the input voltage is greater than or equal to a predefined reset threshold value, the reset threshold value being selected so that the input voltage of the energy supply controller does not leave a regulated input voltage range, even when a finite internal resistance of the energy store is present, as a result of a reset of the output voltage ensuing in a current load reduction of the energy supply controller, the reset threshold value corresponding to a value which can be determined by a third activation threshold added to the product of the maximum current times the internal resistance of the energy store and/or a diode connection to the input of the energy supply controller.

14. A passenger safety unit for a vehicle, comprising:
an occupant and/or road user protection device; and
an energy supply unit for autonomously supplying a consumer, including:
  an energy store to supply electric energy to a consumer when the electrical consumer is decoupled from an energy supply network;
  an energy supply controller having an input coupled to the energy store for receiving electric energy and an output for delivering electric energy to the consumer; and
  a monitoring unit for outputting a monitoring signal, and configured to set the monitoring signal to an active state when an output voltage present between the output and a reference potential is lower than a predefined first activation threshold value or greater than a predefined second activation threshold value, and being configured to reset the monitoring signal to an inactive state when an input voltage present between the input and the reference potential again rises above or is above a reset threshold value;
wherein occupant and/or road user protection device is coupled to the energy supply unit.

15. A method for operating an energy supply unit for autonomously supplying a consumer, the method comprising:
performing one of:
  setting a monitoring signal to an active state when an output voltage present between the output and a reference potential is lower than a predefined first activation threshold value, and a filter time was exceeded, or
  setting the monitoring signal to an active state when an output voltage present between the output and a reference potential is greater than a predefined second activation threshold value, and a filter time was exceeded;
setting the monitoring state so that the monitoring signal is set to an active state if an output voltage present between the output and a reference potential is lower than a predefined first activation threshold value, and an input voltage present between the input of the energy supply unit and a reference potential is lower than a predefined third activation threshold value; and
resetting the monitoring state with the consequence that the monitoring signal is set to an inactive state if an output voltage present between the output and a reference potential is greater than a predefined first activation threshold value and lower than a second activation threshold value, and an input voltage present between the input of the energy supply unit and a reference potential is greater than a predefined third activation threshold value and/or a follow-up time of the monitoring signal has elapsed;
wherein the energy supply unit includes:
  an energy store to supply electric energy to a consumer when the electrical consumer is decoupled from an energy supply network;
  an energy supply controller having an input coupled to the energy store for receiving electric energy and an output for delivering electric energy to the consumer; and
  a monitoring unit for outputting the monitoring signal, and configured to set the monitoring signal to the active state when the output voltage present between the output and the reference potential is lower than the predefined first activation threshold value or greater than the predefined second activation threshold value, and being configured to reset the monitoring signal to the inactive state when the input voltage present between the input and the reference potential again rises above or is above a reset threshold value.

16. A method for operating an energy supply unit for autonomously supplying a consumer, the method comprising:
setting a monitoring signal to an active state when an output voltage present between an output and a reference potential is lower than a predefined activation threshold value; and
bringing the monitoring signal into an inactive state when an input voltage present between an input and the reference potential has risen again above a reset threshold value;
wherein the energy supply unit includes:

an energy store to supply electric energy to a consumer when the electrical consumer is decoupled from an energy supply network;

an energy supply controller having an input coupled to the energy store for receiving electric energy and an output for delivering electric energy to the consumer; and a monitoring unit for outputting a monitoring signal, and configured to set the monitoring signal to the active state when the output voltage present between the output and the reference potential is lower than the predefined first activation threshold value or greater than the predefined second activation threshold value, and being configured to reset the monitoring signal to the inactive state when the input voltage present between the input and the reference potential again rises above or is above the reset threshold value.

17. A non-transitory computer readable medium having a computer program, which is executable by a processor, comprising:

a program code arrangement having program code for operating an energy supply unit for autonomously supplying a consumer, by performing the following:

performing one of:

setting a monitoring signal to an active state when an output voltage present between the output and a reference potential is lower than a predefined first activation threshold value, and a filter time was exceeded, or setting the monitoring signal to an active state when an output voltage present between the output and a reference potential is greater than a predefined second activation threshold value, and a filter time was exceeded;

setting the monitoring state so that the monitoring signal is set to an active state if an output voltage present between the output and a reference potential is lower than a predefined first activation threshold value, and an input voltage present between the input of the energy supply unit and a reference potential is lower than a predefined third activation threshold value; and resetting the monitoring state with the consequence that the monitoring signal is set to an inactive state if an output voltage present between the output and a reference potential is greater than a predefined first activation threshold value and lower than a second activation threshold value, and an input voltage present between the input of the energy supply unit and a reference potential is greater than a predefined third activation threshold value and/or a follow-up time of the monitoring signal has elapsed;

wherein the energy supply unit includes:

an energy store to supply electric energy to a consumer when the electrical consumer is decoupled from an energy supply network;

an energy supply controller having an input coupled to the energy store for receiving electric energy and an output for delivering electric energy to the consumer; and a monitoring unit for outputting a monitoring signal, and configured to set the monitoring signal to the active state when the output voltage present between the output and the reference potential is lower than the predefined first activation threshold value or greater than the predefined second activation threshold value, and being configured to reset the monitoring signal to the inactive state when the input voltage present between the input and the reference potential again rises above or is above the reset threshold value.

* * * * *